(12) United States Patent
He et al.

(10) Patent No.: US 10,062,701 B2
(45) Date of Patent: Aug. 28, 2018

(54) STATIC RANDOM ACCESS MEMORY UNIT CELL

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 61 days.

(21) Appl. No.: 15/361,070

(22) Filed: Nov. 24, 2016

(65) Prior Publication Data

US 2018/0145081 A1    May 24, 2018

(51) Int. Cl.
*H01L 27/11*    (2006.01)
*G11C 11/412*    (2006.01)
*G11C 11/419*    (2006.01)

(52) U.S. Cl.
CPC ........ *H01L 27/1104* (2013.01); *G11C 11/412* (2013.01); *G11C 11/419* (2013.01); *G11C 11/4125* (2013.01); *H01L 27/1116* (2013.01)

(58) Field of Classification Search
CPC .......................... H01L 27/1104; H01L 27/1116
See application file for complete search history.

(56) References Cited

U.S. PATENT DOCUMENTS

| 5,917,247 | A | 6/1999 | Narita | |
|---|---|---|---|---|
| 6,559,510 | B1 | 5/2003 | Yokoyama | |
| 2006/0019488 | A1* | 1/2006 | Liaw | H01L 27/11 438/637 |
| 2011/0233675 | A1* | 9/2011 | Mazure | G11C 11/412 257/347 |
| 2013/0242677 | A1* | 9/2013 | Iyer | G11C 11/412 365/189.15 |
| 2013/0286718 | A1* | 10/2013 | Krilic | G11C 11/412 365/154 |
| 2016/0329094 | A1* | 11/2016 | Luan | H01L 21/8249 |

* cited by examiner

*Primary Examiner* — Douglas Menz
(74) *Attorney, Agent, or Firm* — Winston Hsu (57) ABSTRACT

The present invention provides a SRAM unit cell which includes a semiconductor substrate, six transistors, a first well, two first doped regions and two second doped regions. The transistors are disposed on the semiconductor substrate, and include a first gate line and a second gate line. The first well is disposed in the semiconductor substrate, and the first well has a first conductive type, wherein the first gate line and the second gate line extend onto the first well. The first doped regions are disposed in the first well at two sides of the first gate line, and the second doped regions are disposed in the first well at two sides of the second gate line.

8 Claims, 9 Drawing Sheets

STATIC RANDOM ACCESS MEMORY UNIT CELL

BACKGROUND OF THE INVENTION

1. Field of the Invention

The present invention relates to a static random access memory (SRAM) unit cell, and more particularly, to a SRAM unit cell having two varactors respectively connected to two storage nodes.

2. Description of the Prior Art

The static random access memory (SRAM) is a type of memory that is able to store data without constantly refreshing them as long as it is supplied with power. Because of its high access speed and low power consumption, SRAM has been applied to electronic devices, such as a notebook, a portable device or a video game console.

Conventional SRAM device includes a six-transistor (6-T) cell with two cross-coupled inverters. Each inverter includes a pull-up transistor and a pull-down transistor. A storage node of each inverter is connected to the gates of both transistors of the other inverter. Also, the storage nodes are respectively coupled to two bit lines through two pass gate transistors. The gates of the pass gate transistors are connected to a common word line. During read operation, the bit lines are pre-charged to a high voltage level. Then, the bit lines are floated, and the word line is used to turn on the pass gate transistors. The voltage level of one of the bit lines is pulled down by a low voltage state "0" stored in one of the storage nodes, so that a voltage difference in the bit lines can be detected, and the logic states at the storage nodes can be read. During write operation, the bit lines are provided with programming voltages, and the word line is used to turn on the pass gate transistors, so that the voltages at the storage nodes can be programmed.

However, with the decrease of the high voltage level and the miniaturization of the SRAM device, the read operation of the SRAM device is easily disturbed and fails during high speed read, and the data in storage nodes are easily flipped due to charges from radioactive materials or cosmic rays, thereby increasing the soft error rate (SER) of the SRAM device. Although the storage nodes respectively connected to capacitors with the same capacitance has been developed to effectively store the data and reduce read failure and the SER, this design would reduce the speed of writing the data. Thus, to provide a better SRAM is always in need in this field.

SUMMARY OF THE INVENTION

An objective of the present invention is to provide a SRAM unit cell to reduce the SER, improve the read operation and increase the write speed.

According to an embodiment, a SRAM unit cell is provided and includes a semiconductor substrate, six transistors, a first well, two first doped regions and two second doped regions. The transistors are disposed on the semiconductor substrate, and include a first gate line and a second gate line. The first well is disposed in the semiconductor substrate, and the first well has a first conductive type, wherein the first gate line and the second gate line extend onto the first well. The first doped regions are disposed in the first well at two sides of the first gate line, and the second doped regions are disposed in the first well at two sides of the second gate line.

The SRAM unit cell of the present invention includes the first varactor and the second varactor respectively connected to the first and second storage nodes, and the capacitance of the first varactor can be greater than the capacitance of the second varactor while the voltages of the first and second storage nodes are respectively the same as the voltages provided to the third and second power lines. Since that, during the read operation, the voltage at the first storage node is not easily altered by the radioactive materials or cosmic rays thereby, and the data can be read from the first gate line GL1 without being disturbed and altered. Also, during the write operation, the voltage at the second storage node can be easily altered, thereby increasing the write speed.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
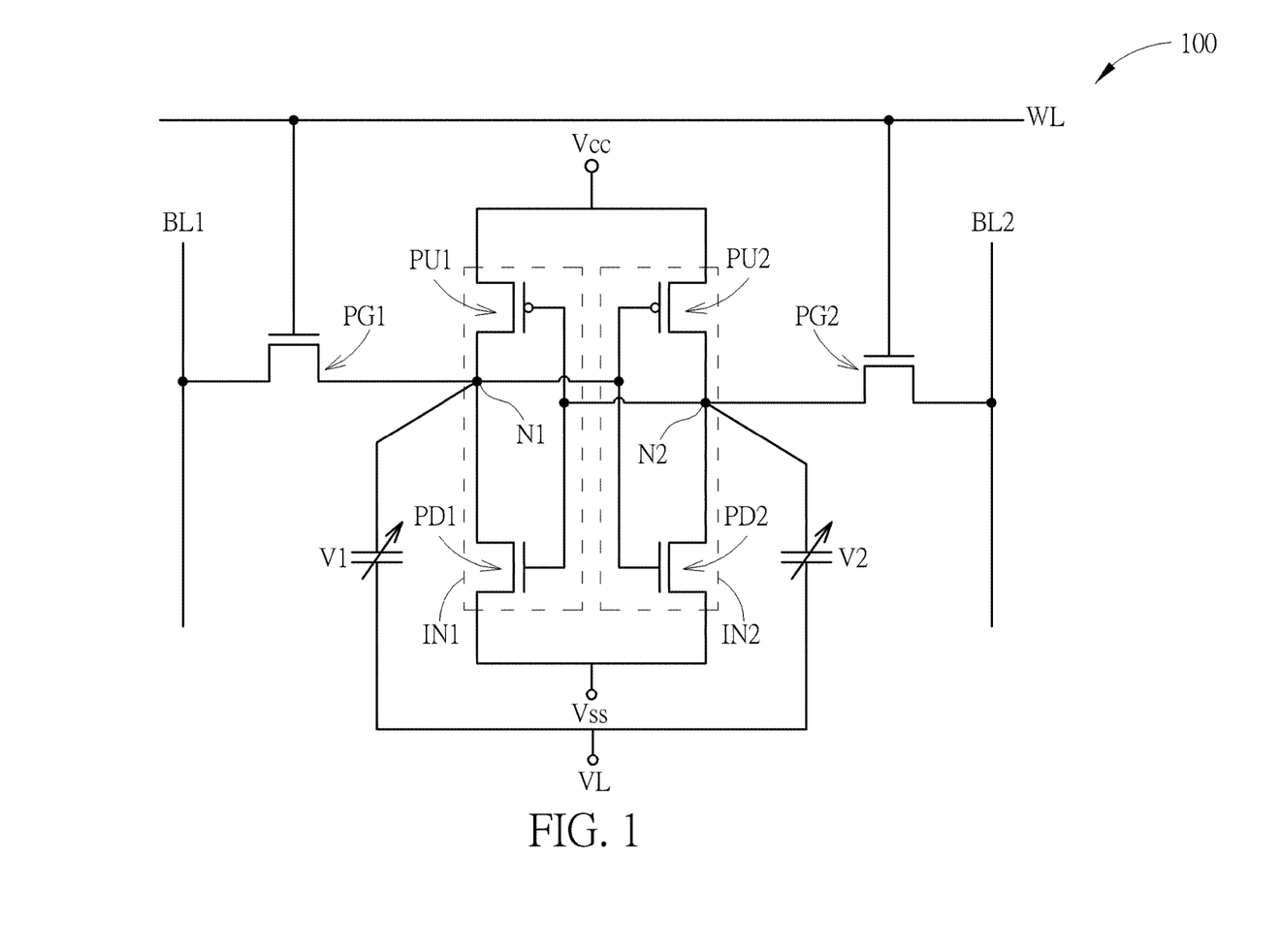
FIG. 1 is an equivalent circuit of a static random access memory (SRAM) unit cell according to a first embodiment of the present invention.

Refer to FIG. 1, which is an equivalent circuit of a static random access memory (SRAM) unit cell according to a first embodiment of the present invention. As shown in FIG. 1, the SRAM unit cell 100 of this embodiment is a six-transistor SRAM (6T-SRAM), which includes a first inverter IN1, a second inverter IN2, a first varactor V1, a second varactor V2, a first pass-gate transistor PG1 and a second pass-gate transistor PG2. In this embodiment, the drain of first pass-gate transistor PG1 and an end of the first varactor V1 are electrically connected to an output of the first inverter IN1 that also represents a first storage node N1 for storing a data, and the drain of second pass-gate transistor PG2 and an end of the second varactor V2 are electrically connected to an output of the second inverter IN2 that also represents a second storage node N2 for storing another data. Since the output of the first inverter IN1 is electrically connected to an input of the second inverter IN2, and the output of the second inverter IN2 is electrically connected to an input of the first inverter IN1, the data stored in the first storage node and the second storage node can be latched to each other.

Furthermore, the other end of the first varactor V1 and the other end of the second varactor V2 are connected to a first power line VL that is provided with a voltage between voltages stored in the first storage node N1 and second storage node N2. The gate of the first pass-gate transistor PG1 and the gate of the second pass-gate transistor PG2 are electrically connected to a same word line WL, the source of the first pass-gate transistor PG1 is electrically connected to a first bit line BL1, and the source of the second pass-gate transistor PG2 is electrically connected to a second bit line BL2. For example, the first varactor V1 and the second varactor V2 respectively may be p-channel metal-oxide-semiconductor (MOS) varactors, preferably accumulation-mode MOS varactors. The first pass-gate transistor PG1 and the second pass-gate transistor PG2 may be n-type transistor, such as n-type metal-oxide-semiconductor field effect transistor (NMOSFET).

It should be noted that since the voltage provided to the first power line VL is between the voltages stored in the first and second storage node N1 and N2, preferably substantially ranged from ⅓ to ⅔ times the voltage provided by the second power line Vcc, the voltage across the first varactor V1 and the voltage across the second varactor V2 are opposite, thereby resulting in the difference of the capacitances of the first and second varactor V1 and V2. Specifically, the capacitance of the first varactor V1 can be greater than the capacitance of the second varactor V2 while the voltage in the first storage node N1 is less than the voltage in the second storage node N2. Under this circumstance, the data is read from the first storage node N1, and data is written into the SRAM unit cell 100 through the second storage node N2. Since the first storage node N1 is connected to the first varactor V1 with higher capacitance, the data can be stored in the first storage node N1 well. Accordingly, the data of a low voltage can be read without disturbing the voltage in the first storage node N1 during the read operation. Also, since the second storage node N2 is connected to the second varactor V2 with lower capacitance, the data stored in the second storage node N2 can be easily programmed, thereby increasing the write speed during the write operation. Also, the capacitance of the first varactor V1 can be less than the capacitance of the second varactor V2 while the voltage in the first storage node N1 is greater than the voltage in the second storage node N2.

Additionally, the first inverter IN1 includes a first pull-up transistor PU1 and a first pull-down transistor PD1, and the second inverter IN2 includes a second pull-up transistor PU2 and a second pull-down transistor PD2. The first pull-up transistor PU1 and the second pull-up transistor PU2 are p-type field effect transistors (pFET), such as p-type metal-oxide-semiconductor field effect transistors (PMOSFET), and the first pull-down transistor PD1 and the second pull-down transistor PD2 are n-type FETs (nFET), such as NMOSFETs. Drains of the first pull-up transistor PU1 and the first pull-down transistor PD1 which are regarded as the output of the first inverter IN1 are connected to the first storage node N1, and gates of the first pull-up transistor PU1 and the first pull-down transistor PD1 which are regarded as the input of the first inverter IN1 are connected to the second storage node N2. Likewise, drains of the second pull-up transistor PU2 and the second pull-down transistor PD2 which are regarded as the output of the second inverter IN2 are connected to the second storage node N2, and gates of the second pull-up transistor PU2 and the second pull-down transistor PD2 which are regarded as the input of the second inverter IN2 are connected to the first storage node N1. A source of the first pull-up transistor PU1 and a source of the second pull-up transistor PU2 are electrically connected to a second power line Vcc, such as a voltage power source, and a source of the first pull-down transistor PD1 and a source of the second pull-down transistor PD2 are electrically connected to a third power line Vss, such as ground. In another embodiment, since the first pull-up transistor PU1 and the second pull-up transistor PU2 act as power load devices, they can be replaced by resistors, and the SRAM unit cell can be a four-transistor SRAM (4T-SRAM).

Figure 2:
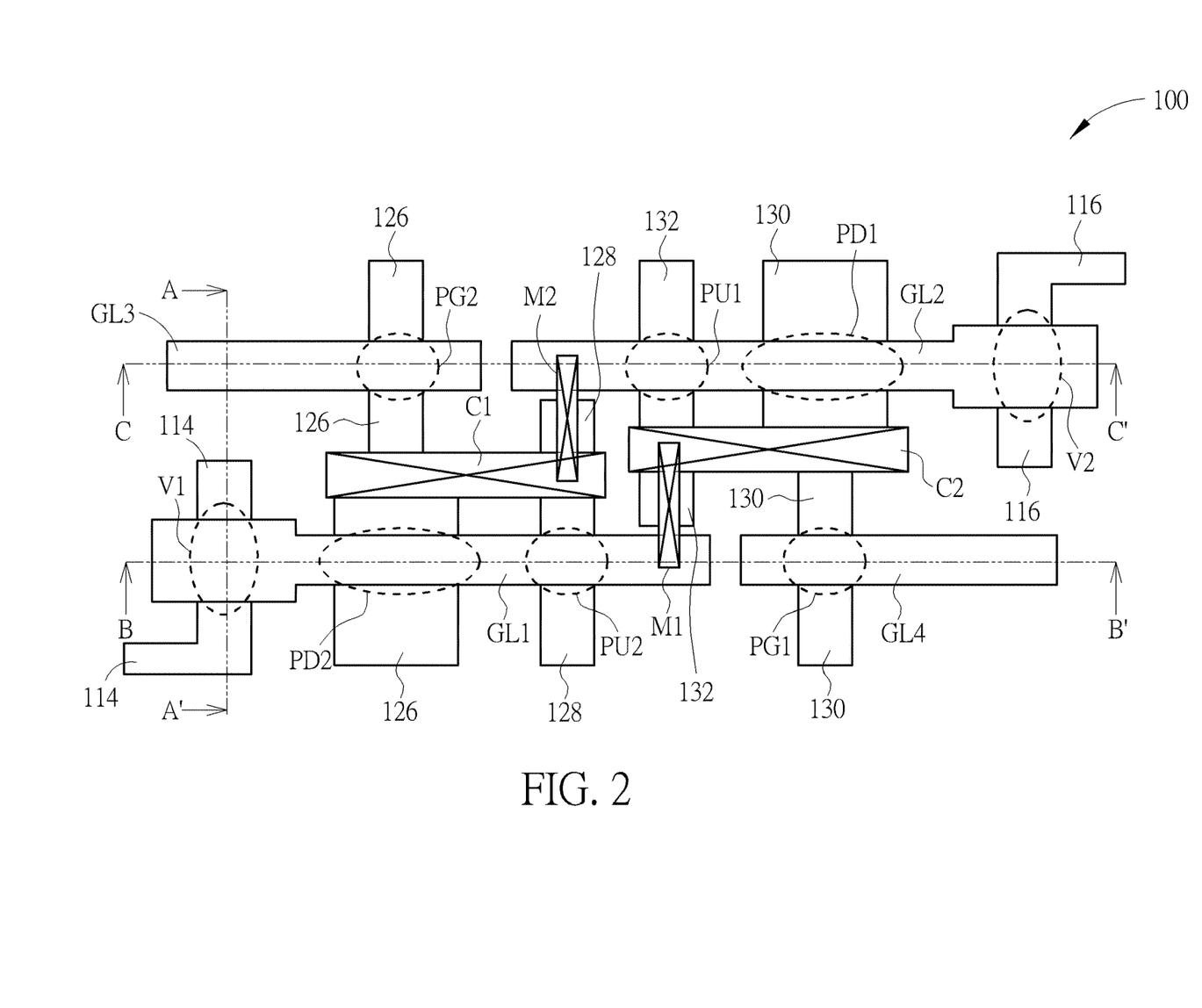
FIG. 2 schematically illustrates a layout diagram of the SRAM unit cell according to the first embodiment of the present invention.
Figure 3:
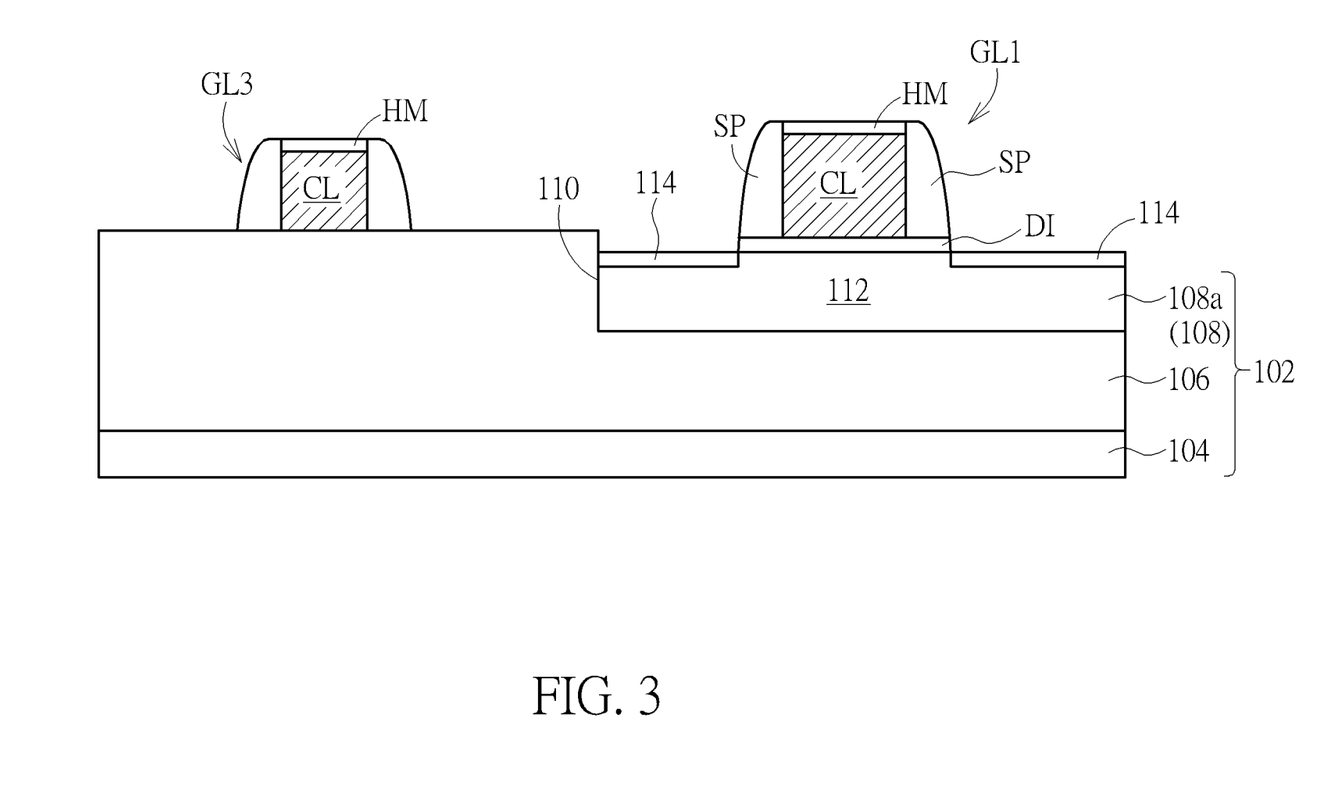
FIGS. 3-5 respectively illustrate cross-sectional views taken along a line A-A', a line B-B' and a line C-C' of FIG. 1.
Figure 4:
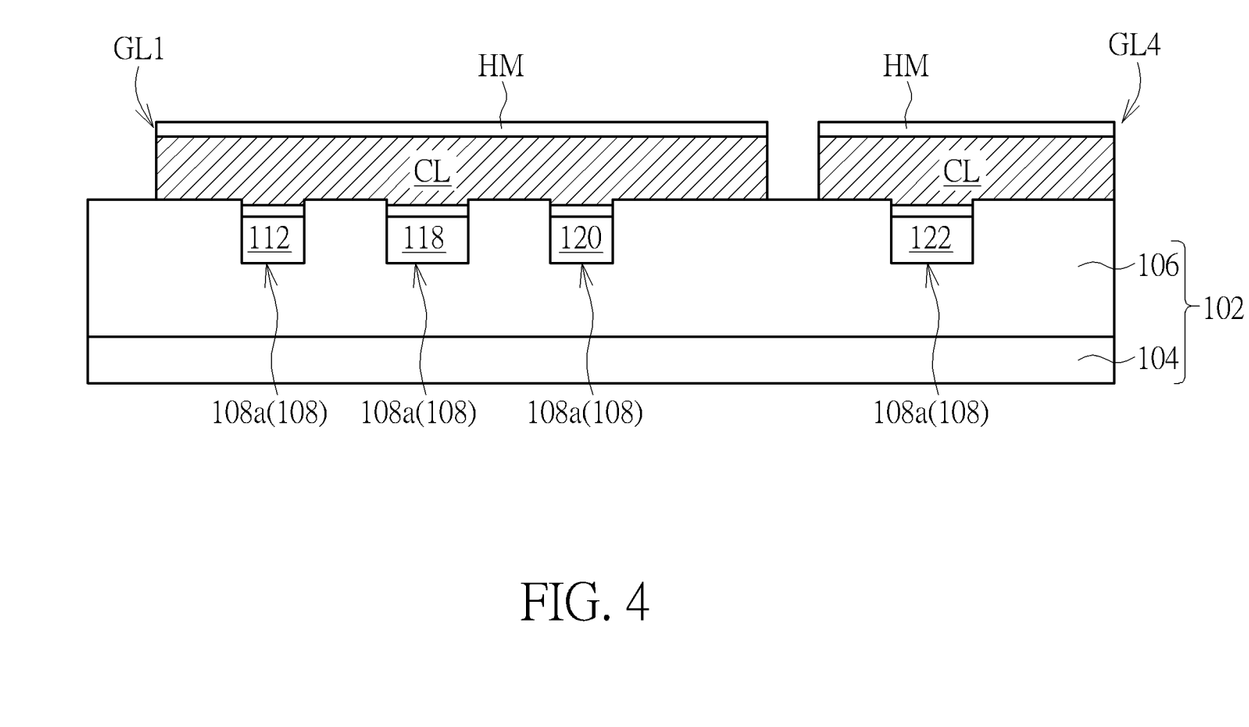
Figure 5:
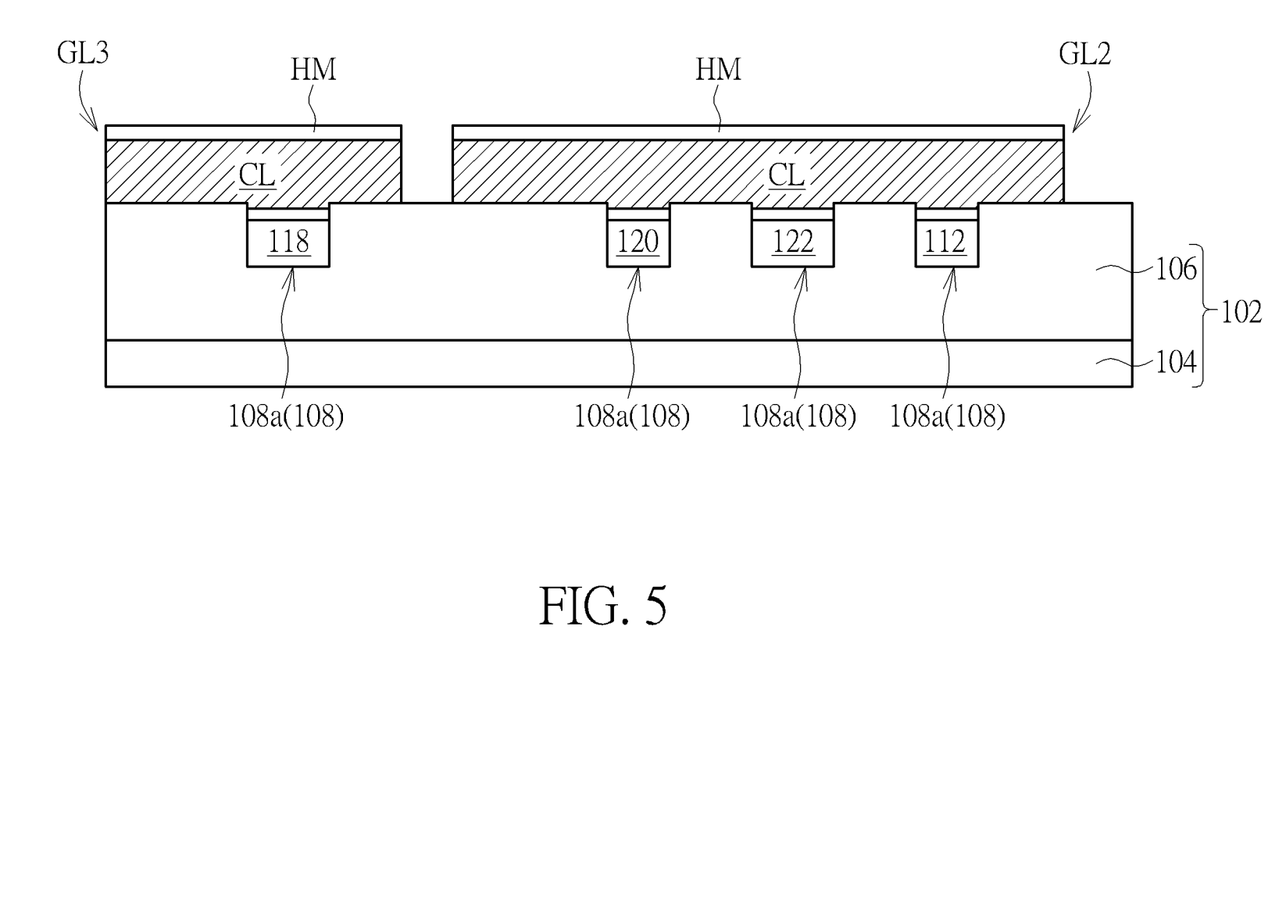

Referring to FIGS. 2-5 as well as FIG. 1, FIG. 2 schematically illustrates a layout diagram of the SRAM unit cell according to the first embodiment of the present invention, and FIGS. 3-5 respectively illustrate cross-sectional views taken along a line A-A', a line B-B' and a line C-C' of FIG. 1. As shown in FIGS. 1-5, the SRAM unit cell 100 includes a semiconductor substrate 102 that is used to form the above-mentioned devices thereon. In this embodiment, the semiconductor substrate 102 may be a silicon-on-insulator (SOI) substrate, which includes a substrate 104, an isolation layer 106 and a semiconductor layer 108, but the present invention is not limited thereto. In another embodiment, the semiconductor substrate 102 may be, for example, a silicon substrate, a substrate including silicon or semiconductor materials. The semiconductor substrate 102 may be a planar substrate, or a plurality of fin-shaped structures (not shown) may be formed on the semiconductor substrate 102. In this embodiment, the isolation layer 106 may be for example formed of silicon oxide, but not limited thereto. The semiconductor layer 108 may be for example formed of silicon by an epitaxial process, but not limited thereto. The isolation layer 106 covers the substrate 104 and may be formed to have a plurality of trenches 110, and the semiconductor layer 108 is formed in the trenches 110 and is separated into a plurality of semiconductor blocks 108a by the isolation layer 106.

The SRAM unit cell 100 may further include two first wells 112, two first doped regions 114 and two second doped regions 116 that are used to form the first varactor V1 and the second varactor V2. Specifically, the first wells 112 are spaced apart from each other and respectively disposed in two of the semiconductor blocks 108a at two sides of the above-mentioned transistors which are the first and the second pull-up transistors PU1 and PU2, the first and the second pull-down transistors PD1 and PD2 and the first and the second pass-gate transistors PG1 and PG2, so that the first wells 112 can be isolated from each other by the isolation layer 106. The SRAM unit cell 100 may further include a first gate line GL1 and a second gate line GL2 respectively extending onto the first wells 112, in which the first gate line GL1 can serve as an end (or a gate) of the first varactor V1, and the second gate line can serve as an end of the second varactor V2. The first doped regions 114 are disposed in one of the first wells 112 that the first gate line GL1 crosses over and at two sides of the first gate line GL1, and serves as the other end (or a source and a drain) of the first varactor V1, so that the first varactor V1 can be composed of the first gate line GL1, one of the first wells 112 and the first doped regions 114. Also, the first doped regions 114 may be further electrically connected to the first power line VL through contact plugs. The second doped regions 116 are disposed in the other one of the first wells 112 that the second gate line GL2 crosses over and at two sides of the second gate line GL2, and serves as the other end (or a source and a drain) of the second varactor V2, so that the second varactor V2 can be composed of the second gate line GL2, the other one of the first wells 112 and the second doped regions 116. The first doped regions 114 may be further electrically connected to the first power line VL through contact plugs. In this embodiment, the first wells 112, the first doped regions 114 and the second doped regions 116 have a first conductive type, such as p type, in which the doping concentration of each first doped region 114 may be greater than that of the corresponding first well 112, and the doping concentration of each second doped region 116 may be greater than that of the corresponding first well 112.

In this embodiment, the SRAM unit cell 100 may further include a second well 118, a third well 120, a fourth well 122 and a fifth well 124 respectively disposed in the semiconductor blocks 108a between the first wells 112, and they can be isolated from each other and the first wells 112 by the isolation layer 106. The second well 118, the third well 120, the fifth well 124 and the fourth well 122 are sequentially arranged along a direction perpendicular to the extending directions of them. The first gate line GL1 is disposed on the second well 118 and the third well 120 and crosses the second well 118 and the third well 120 so as to serve as the gates of the second pull-up transistor PU2 and the second pull-down transistor PD2. Accordingly, the gate of the first varactor V1 and the gates of the second pull-up transistor PU2 and the second pull-down transistor PD2 share the same first gate line GL1 so as to be electrically connected to each other. A third gate line GL3 may be further included in the SRAM unit cell 100, which is disposed on the second well 118 and crosses the second well 118 so as to serve as the gate of the second pass-gate transistor PG2. Three third doped regions 126 may be further included in the SRAM unit cell 100, which are disposed in the second well 118 and separated from each other, and the first gate line GL1 and the third gate line GL3 are respectively disposed between any two of the third doped regions 126 adjacent to each other. The second pull-down transistor PD2 and the second pass-gate transistor PG2 can share the same one of the third doped regions 126 between the first gate line GL1 and the third gate line GL3 as their drains, and the other two of the third doped regions 126 respectively serve as the sources of the second pull-down transistor PD2 and the second pass-gate transistor PG2. Two fourth doped regions 128 may be further included in the SRAM unit cell 100, which are disposed in the third well 120 at two side of the first gate line GL1 respectively and serve as the source and the drain of the second pull-up transistor PU2. One of the third doped regions 126 as the drain of the second pull-down transistor PD2 and one of the fourth doped regions 128 as the drain of the second pull-up transistor PU2 can be electrically connected by a contact plug C1. The third doped region 126 as the source of the second pass-gate transistor PG2 may be electrically coupled to the second bit line BL2 through another contact plug (not shown).

The second gate line GL2 is disposed on the fourth well 122 and the fifth well 124 and crosses the fourth well 122 and the fifth well 124 so as to serve as the gates of the first pull-up transistor PU1 and the first pull-down transistor PD1. Accordingly, the gate of the second varactor V2 and the gates of the first pull-up transistor PU1 and the first pull-down transistor PD1 share the same second gate line GL2 so as to be electrically connected to each other. The SRAM unit cell 100 may further include a fourth gate line GL4 disposed on the fourth well 122 and crosses the fourth well 122 so as to serve as the gate of the first pass-gate transistor PG1. Three fifth doped regions 130 may be further included in the SRAM unit cell 100, which are disposed in the fourth well 122 and separated from each other, and the second gate line GL2 and the fourth gate line GL4 are respectively disposed between any two of the fifth doped regions 130 adjacent to each other. The first pull-down transistor PD1 and the first pass-gate transistor PG1 can share the same one of the fifth doped regions 130 between the second gate line GL2 and the fourth gate line GL4 as their drains, and the other two of the fifth doped regions 130 respectively serve as the sources of the first pull-down transistor PD1 and the first pass-gate transistor PG1. Two sixth doped regions 132 may be further included in the SRAM unit cell 100, which are disposed in the fifth well 124 at two side of the second gate line GL2 respectively and serve as the source and the drain of the first pull-up transistor PU1. One of the fifth doped regions 130 as the drain of the first pull-down transistor PD1 and one of the sixth doped regions 132 as the drain of the first pull-up transistor PU1 can be electrically connected by another contact plug C2. Also, the sixth doped region 132 as the drain of the first pull-up transistor PU1 can be further electrically connected to the first gate line GL1 through an interconnect M1, and the fourth doped region 128 as the drain of the second pull-up transistor PU2 can be further electrically connected to the second gate line GL2 through an interconnect M2. The interconnects M1 and M2 may be formed on the corresponding contact plug C2 and C1 respectively while the interconnects M1 and M2 overlap the corresponding contact plug C2 and C1. The fourth doped region 130 as the source of the first pass-gate transistor PG1 may be electrically coupled to the first bit line BL1 through another contact plug (not shown). The fourth doped region 128 as the source of the second pull-up transistor PU2 and the sixth doped region 132 as the source of the first pull-up transistor PU1 may be electrically connected to the second power line Vcc through another contact plugs (not shown). The third doped region 126 as the source of the second pull-down transistor PD2 and the fifth doped region 130 as the source of the first pull-down transistor PD1 may be electrically connected to the third power line Vss through another contact plugs (not shown).

In this embodiment, the first, second, third and fourth gate lines GL1, GL2, GL3 and GL4 may respectively include a dielectric layer DI and a conductive layer CL sequentially disposed on the semiconductor substrate 102. Specifically, the dielectric layer DI may be formed by a thermal oxidation process, thereby being only disposed on the semiconductor blocks and between each semiconductor block and the conductive layer CL, but the present invention is not limited thereto. Also, those skilled in the art should know each gate line may include spacers SP disposed on the sidewalls of the conductive layer CL, a hard mask layer HM disposed on the conductive layer CL and other related elements.

Additionally, the second well 118, the fourth well 122, the fourth doped regions 128 and the sixth doped region 132 have the first conductive type, and the third well 120, the fifth well 124, the third doped regions 126 and the fifth doped region 130 have a second conductive type complementary to the first conductive type, such as n type. Since the conductive type of each first well 112 is the same as the conductive types of each first doped region 114 and each second doped region 116, the first varactor V1 and the second varactor V2 in this embodiment may respectively be an accumulation-mode MOS varactor, but the present invention is not limited thereto. In another embodiment, the first doped regions 114 and the second doped region 116 may have the second conductive type different from the first wells 112, so that the first varactor V1 and the second varactor V2 may be NMOS varactors or inversion-mode NMOS varactors.

It should be noted that the voltage provided to the first power line VL is between the voltage provided to the second power line Vcc and the voltage provided to the third power line Vss, preferably substantially ranged from ⅓ to ⅔ times the voltage difference between the second and third power lines Vcc and Vss. Accordingly, when the voltage of the first storage node N1 that is the second gate line GL2 is substantially the same as the voltage provided to the third power line Vss, the voltage difference between the second gate line GL2 and the first doped regions 114 is negative, and the holes in the first well 112 are attracted to be near the second gate line GL2, thereby narrowing the depletion region in the first well 112 and increasing the capacitance of the first varactor V1. At the same time, the voltage of the second storage node N2 that is the first gate line GL1 is substantially the same as the second power line Vcc, so that the voltage difference between the first gate line GL1 and the second doped regions 116 is positive, and the holes in the first well 112 are repelled away from the first gate line GL1, thereby widening the depletion region in the first well 112 and reducing the capacitance of the second varactor V2. For example, the capacitance of the first varactor V1 may be at least 3 times larger than the capacitance of the second varactor V2, preferably 5 to 10 times. Since the capacitance of the first varactor V1 is greater than the capacitance of the second varactor V2, during the read operation, the voltage in the first gate line GL1 is not easily altered by the radioactive materials or cosmic rays. Accordingly, the SER can be reduced, and the data can be read from the first gate line GL1 without being disturbed and altered. Also, during the write operation, since the second varactor V2 has lower capacitance, the voltage in the second gate line GL2 can be easily altered, thereby increasing the write speed. Furthermore, in this embodiment, the area of the SRAM unit cell 100 is only 25 percent greater than the area of the transistors, and thus, the first varactor V1 and the second varactor V2 would not largely increase the size of the SRAM unit cell 100.

The SRAM unit cell of the present invention is not limited to the above-mentioned embodiment. The following description continues to detail the other embodiments or variants, and in order to simplify and show the difference between the other embodiments or variants and the above-mentioned embodiment, the same numerals denote the same components in the following description, and the same parts are not detailed redundantly.

Figure 6:
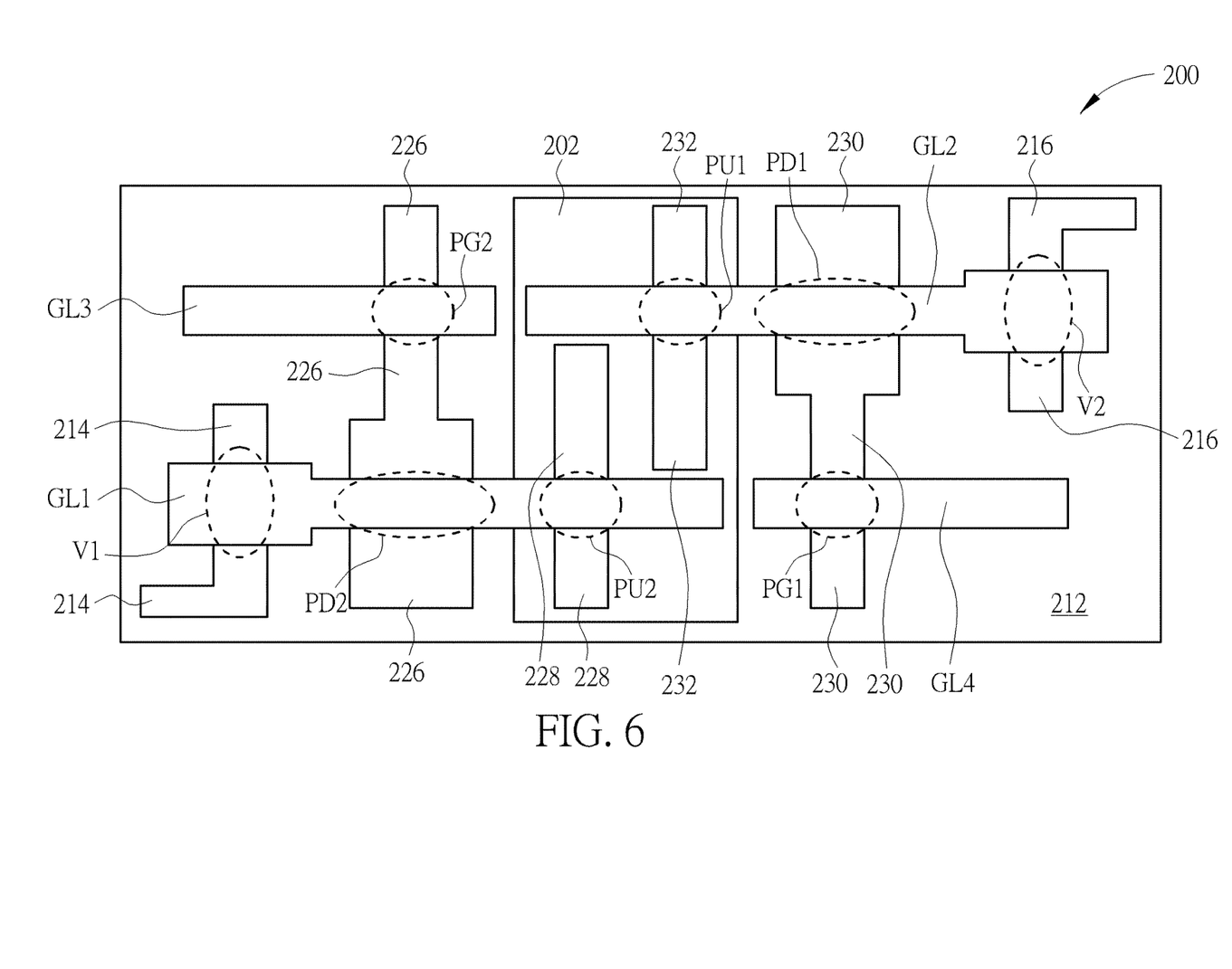
FIG. 6 schematically illustrates a layout diagram of a SRAM unit cell according to a second embodiment of the present invention.

Refer to FIG. 6, which schematically illustrates a layout diagram of a SRAM unit cell according to a second embodiment of the present invention. As shown in FIG. 6, as compared to the first embodiment, the semiconductor blocks in the SRAM unit cell 200 of this embodiment are connected to each other, i.e. the semiconductor layer is a continuous layer and doesn't be separated by the isolation layer or the semiconductor substrate is formed of a silicon substrate. Also, the first wells may be connected to each other and formed to be as one first well 212 in this embodiment. Specifically, the first, second, third and fourth gate lines GL1, GL2, GL3 and GL4 are disposed on the first well 212 and spaced apart from each other, so that the first well 212 can be used to form the first pull-down transistor PD1, the first pass-gate transistor PG1, the second pull-down transistor PD2 and the second pass-gate transistor PG2. Besides the first doped regions 214 and the second doped regions 216, the third doped regions 226 and the fifth doped regions 230 may also be disposed in the first well 212 respectively. The first gate line GL1 and the third gate line GL3 are disposed between any two of the third doped regions 226 adjacent to each other respectively, and the second gate line GL2 and the fourth gate line GL4 are disposed between any two of the fifth doped regions adjacent to each other respectively. Also, a second well 202 may be included by the SRAM unit cell 200 may be disposed in the first well 212, and the second well 202 has the second conductive type. The fourth doped regions 228 are disposed in the second well 202 at two sides of the first gate line GL1, and the sixth doped regions 232 are disposed in the second well 202 at two sides of the second gate line GL2. All of the doped regions in this embodiment are spaced apart from each other. The connections between the gate lines and the doped regions in this embodiment are the same as the first embodiment, and will not be redundantly detailed.

Figure 7:
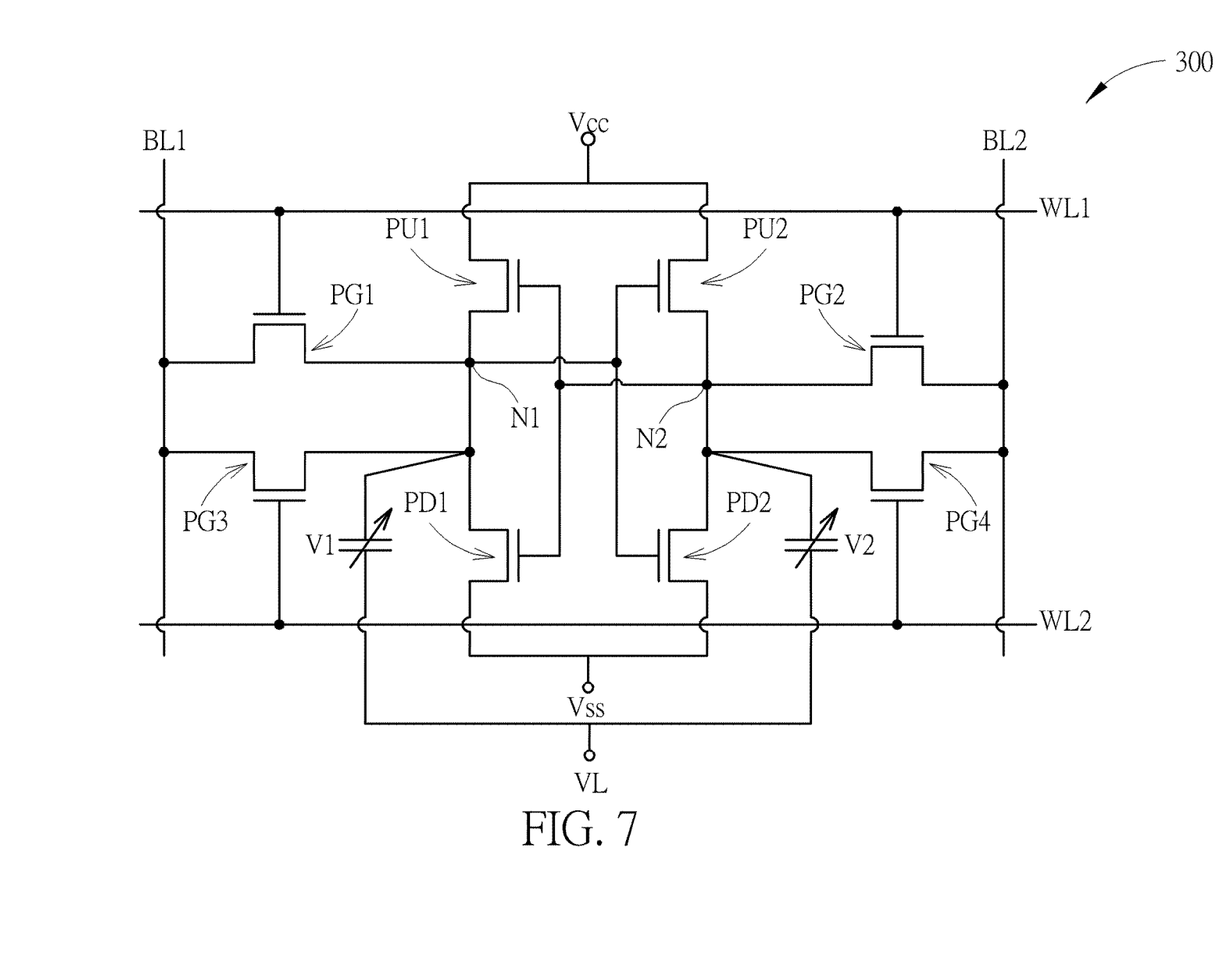
FIG. 7 is an equivalent circuit of a SRAM unit cell according to a third embodiment of the present invention.
Figure 8:
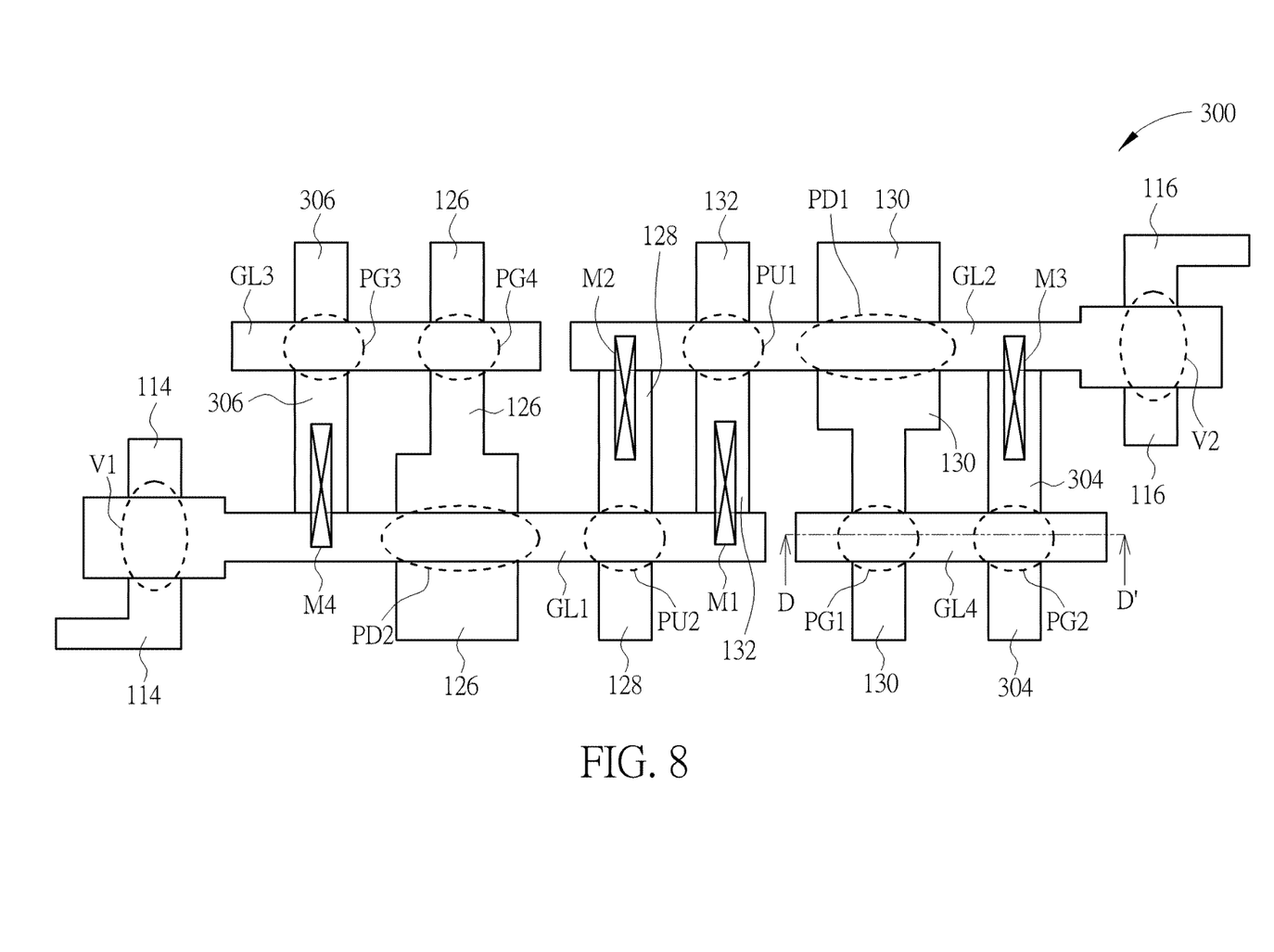
FIG. 8 schematically illustrates a layout diagram of a SRAM unit cell according to the third embodiment of the present invention.
Figure 9:
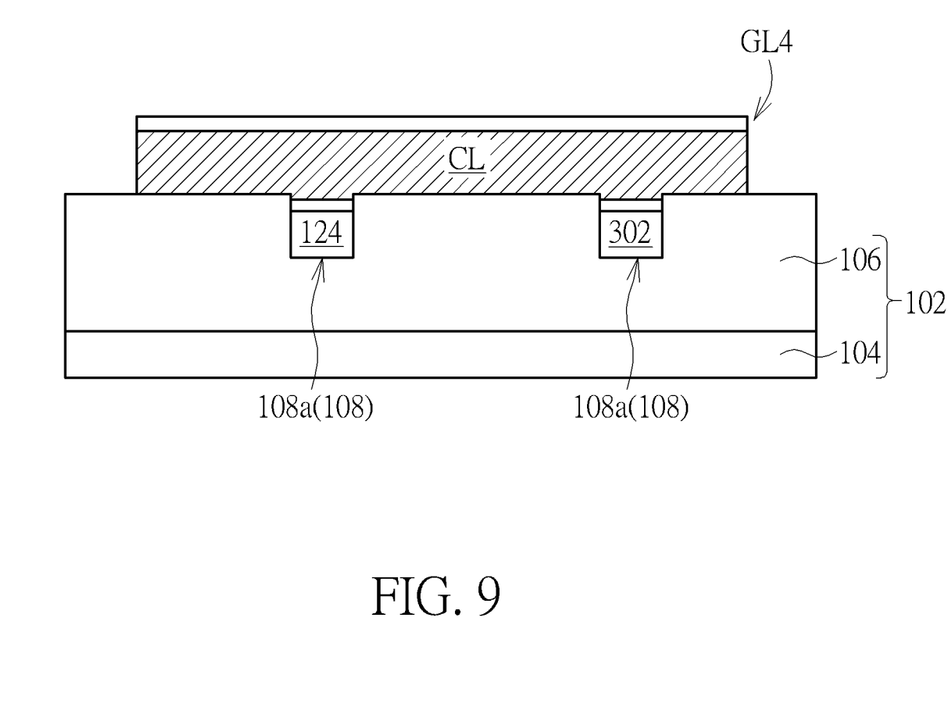
FIG. 9 illustrates a cross-sectional view taken along a line D-D' of FIG. 8.

Referring to FIGS. 7-9, FIG. 7 is an equivalent circuit of a SRAM unit cell according to a third embodiment of the present invention, FIG. 8 schematically illustrates a layout diagram of the SRAM unit cell according to the third embodiment of the present invention, and FIG. 9 illustrates a cross-sectional view taken along a line D-D' of FIG. 8. As shown in FIG. 7, the SRAM unit cell 300 of this embodiment is an eight-transistor SRAM (8T-SRAM). In this embodiment, the SRAM unit cell 300 further includes a third pass-gate transistor PG3 and a fourth pass-gate transistor PG4 as compared with the first embodiment. The third pass-gate transistor PG3 and the fourth pass-gate transistor PG4 maybe respectively n-type transistors, such as NMOS-FETs. The gates of the first and second pass-gate transistors PG1 and PG2 are electrically connected to a first word line WL1, and gates of the third and fourth pass-gate transistors PG3 and PG4 are electrically connected to a second word line WL2. A drain and a source of the third pass-gate transistor PG3 are respectively electrically connected to the drain and the source of the first pass-gate transistor PG1 so as to be respectively electrically connected to the first storage node N1 and the first bit line BL1 respectively. A drain and a source of the fourth pass-gate transistor PG4 are respectively electrically connected to the drain and the source of the second pass-gate transistor PG2 so as to be respectively electrically connected to the second storage node N1 and the second bit line BL1.

As shown in FIGS. 8 and 9, the SRAM unit cell 300 further includes two sixth wells 302, two seventh doped regions 304, and two eighth doped regions 306 as compared with the first embodiment. The sixth wells 302 are disposed in the semiconductor substrate 102 between the first wells 112, and are respectively disposed between one of the first wells 112 and the second well 118 and between the other one of the first wells 112 and the fourth well 122. The fourth gate line GL4 is disposed on one of the sixth wells 302 and crosses it, and the seventh doped regions 304 are disposed in this sixth well 302 at two sides of the fourth gate line GL4. In this embodiment, the second pass-gate transistor PG2 is constituted by this sixth well 302, the fourth gate line GL4 and the seventh doped regions 304. Similar to the structure of the first pass-gate transistor PG1 and the second pass-gate transistor PG2, the third gate line GL3 is disposed on the other one of the sixth wells 302 at two sides of the third gate line GL3 and crosses this sixth well 302, and the eighth doped regions 306 are disposed in this sixth well 302 at two sides of the third gate line GL3. The sixth wells 302 have the first conductive type, and the seventh doped regions 304 and the eighth doped regions 306 have the second conductive type. Accordingly, the fourth pass-gate transistor PG4 can be constituted by the second well 118, the third gate line GL3 and the third doped regions 126, and the third pass-gate transistor PG3 can be constituted by the other one of the sixth wells 302, the third gate line GL3 and the eighth doped regions 306. Furthermore, one of the seventh doped regions between the second gate line GL2 and the fourth gate line GL4 may be electrically connected to the second gate line GL2 through another interconnect M3. One of the eighth doped regions between the first gate line GL1 and the third gate line GL3 may be electrically connected to the first gate line GL1 through another interconnect M4. In the SRAM unit cell of this embodiment, the stability can be improved. Also, in this embodiment, the area of the SRAM unit cell 300 is only 10 percent greater than the area of the eight transistors, and thus, the first varactor V1 and the second varactor V2 would increase the size of the SRAM unit cell 300 less than the SRAM unit cell of the first embodiment. The type of the SRAM unit cell of the present invention is not limited to this embodiment, and the third and fourth pass-gate transistors may be applied to the SRAM unit cell to achieve different functions according to the design requirements.

As the above-mentioned description, the SRAM unit cell includes the first varactor and the second varactor respectively connected to the first and second storage nodes, and the capacitance of the first varactor can be greater than the capacitance of the second varactor while the voltages of the first and second storage nodes are respectively the same as the voltages provided to the third and second power lines. Since that, during the read operation, the voltage at the first storage node is not easily altered by the radioactive materials or cosmic rays thereby reducing the SER, and the data can be read from the first gate line GL1 without being disturbed and altered. Also, during the write operation, the voltage at the second storage node can be easily altered, thereby increasing the write speed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) unit cell, comprising:
   a semiconductor substrate, wherein the semiconductor substrate comprises:
      a substrate; and
      an isolation layer disposed on the substrate;
   six transistors disposed on the semiconductor substrate, the transistors comprising a first gate line and a second gate line;
   a first well disposed in the semiconductor substrate, and the first well having a first conductive type, wherein the first gate line and the second gate line extend onto the first well, the first well comprises two first wells spaced apart from each other and disposed at two sides of the transistors, and the first wells are respectively disposed in the isolation layer and isolated from each other by the isolation layer;
   two first doped regions disposed in the first well at two sides of the first gate line, wherein the first doped regions are disposed in one of the first wells; and
   two second doped regions disposed in the first well at two sides of the second gate line, wherein the first doped regions are electrically connected to the second doped regions and a first power line, and the second doped regions are disposed in the other one of the first wells.

2. The SRAM unit cell according to claim 1, wherein the first doped regions and the second doped regions have the first conductive type.

3. The SRAM unit cell according to claim 1, wherein the transistors further comprise:
   a second well, a third well, a fourth well and a fifth well disposed in the isolation layer between the first wells and isolated from each other by the isolation layer, wherein the second well and the fourth well have the first conductive type, the third well and the fifth well have a second conductive type complementary to the first conductive type, the first gate line is disposed on the second well and the third well, and the second gate line is disposed on the fourth well and the fifth well;
   a third gate line disposed on the second well;
   a fourth gate line disposed on the fourth well;
   three third doped regions disposed in the second well, and the first gate line and the third gate line being disposed between any two of the third doped regions adjacent to each other respectively, wherein the third doped regions have the second conductive type;
   two fourth doped regions disposed in the third well at two side of the first gate line respectively, wherein the fourth doped regions have the first conductive type;
   three fifth doped regions disposed in the fourth well, and the second gate line and the fourth gate line being disposed between any two of the fifth doped regions adjacent to each other respectively, wherein the fifth doped regions have the second conductive type; and
   two sixth doped regions disposed in the fifth well at two side of the second gate line respectively, wherein the sixth doped regions have the first conductive type.

4. The SRAM unit cell according to claim 3, wherein the first gate line is electrically connected to one of the sixth doped regions, and the second gate line is electrically connected to one of the fourth doped regions.

5. The SRAM unit cell according to claim 4, wherein the one of the sixth doped regions is electrically connected to one of the fifth doped regions between the second gate line and the fourth gate line, and the one of the fourth doped regions is electrically connected to one of the third doped regions between the first gate line and the third gate line.

6. The SRAM unit cell according to claim 4, wherein the other one of the sixth doped regions and the other one of the fourth doped regions are electrically connected to a second power line.

7. The SRAM unit cell according to claim 6, wherein the first power line is provided with a voltage substantially ranged from ⅓ to ⅔ times another voltage provided by the second power line.

8. The SRAM unit cell according to claim 3, further comprising:
   two sixth wells disposed in the semiconductor substrate and between the first wells, wherein the sixth wells have the first conductive type, the third gate line is disposed on one of the sixth wells, and the fourth gate line is disposed on the other one of the sixth wells;
   two seventh doped regions disposed in the one of the sixth wells, and one of the seventh doped regions being electrically connected to the first gate line, wherein the seventh doped regions have the second conductive type; and
   two eighth doped regions disposed in the other one of the sixth wells, and one of the eighth doped regions being electrically connected to the second gate line, wherein the eighth doped regions have the second conductive type.

* * * * *